(12) United States Patent
Hashimoto et al.

(10) Patent No.: US 12,704,793 B2
(45) Date of Patent: Aug. 11, 2026

(54) PROCESSING LIQUID SUPPLY APPARATUS AND PROCESSING LIQUID SUPPLY METHOD

(71) Applicant: Tokyo Electron Limited, Tokyo (JP)

(72) Inventors: Kazuya Hashimoto, Koshi City (JP); Hikaru Akada, Koshi City (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 107 days.

(21) Appl. No.: 18/669,792

(22) Filed: May 21, 2024

(65) Prior Publication Data

US 2024/0393706 A1 Nov. 28, 2024

(30) Foreign Application Priority Data

May 24, 2023 (JP) ................................ 2023-085749

(51) Int. Cl.
*G03F 7/20* (2006.01)
*G03F 7/00* (2006.01)

(52) U.S. Cl.
CPC ................................ *G03F 7/70991* (2013.01)

(58) Field of Classification Search
CPC ........... G03F 7/70991; H01L 21/67075; H01L 21/67005; H01L 21/6773; B67D 7/0288; B67D 2210/00049
See application file for complete search history.

(56) References Cited

U.S. PATENT DOCUMENTS

2015/0096682 A1* 4/2015 Nakashima ............. G03F 7/162 414/217
2020/0357630 A1* 11/2020 Hashimoto ....... H01L 21/67017

FOREIGN PATENT DOCUMENTS

JP 2017-076670 A 4/2017

* cited by examiner

*Primary Examiner* — Mesfin T Asfaw
(74) *Attorney, Agent, or Firm* — Nath, Goldberg & Meyer; Jerald L. Meyer; Tanya E. Harkins

(57) ABSTRACT

A processing liquid supply apparatus for supplying a processing liquid to a substrate processing apparatus including a liquid processing module configured to process a substrate with the processing liquid, comprising: a transfer region where a transfer mechanism configured to hold and transfer a container storing the processing liquid is provided, and a pair of supply regions provided to face each other via the transfer region, wherein a supporter configured to support the container loaded from an outside of the processing liquid supply apparatus and a connection pipe connected to the container supported by the supporter are provided in each of the pair of supply regions, and the processing liquid in the container supported by the supporter is supplied to the substrate processing apparatus via the connection pipe.

11 Claims, 9 Drawing Sheets

PROCESSING LIQUID SUPPLY APPARATUS AND PROCESSING LIQUID SUPPLY METHOD

CROSS-REFERENCE TO RELATED APPLICATION

This application is based upon and claims the benefit of priority from Japanese Patent Application No. 2023-085749, filed on May 24, 2023, the entire contents of which are incorporated herein by reference.

TECHNICAL FIELD

The present disclosure relates to a processing liquid supply apparatus and a processing liquid supply method.

BACKGROUND

Patent Document 1 discloses a processing liquid supply apparatus that supplies multiple types of processing liquids stored in a plurality of containers to a plurality of substrate processing systems provided with liquid processing parts that perform liquid processing on a substrate using a processing liquid from the outside of the substrate processing systems. The processing liquid supply apparatus includes a plurality of container stages on which containers storing processing liquids are placed, and a plurality of processing liquid flow paths that connects the containers placed on the container stages and the plurality of substrate processing systems. Further, the processing liquid supply apparatus includes a processing liquid supplier that forcibly feeds the processing liquid in the container to the plurality of processing systems via the plurality of processing liquid flow paths and a plurality of pipe ducts that collectively encloses the plurality of processing liquid flow paths connected to a substrate processing system with respect to each substrate processing system.

PRIOR ART DOCUMENTS

Patent Documents

Patent Document 1: Japanese Patent Laid-Open Publication No. 2017-076670

SUMMARY

According to an embodiment of the present disclosure, a processing liquid supply apparatus for supplying a processing liquid to a substrate processing apparatus including a liquid processing module configured to process a substrate with the processing liquid is provided. The processing liquid supply apparatus comprises a transfer region where a transfer mechanism configured to hold and transfer a container storing the processing liquid is provided, and a pair of supply regions provided to face each other via the transfer region, wherein a supporter configured to support the container loaded from an outside of the processing liquid supply apparatus and a connection pipe connected to the container supported by the supporter are provided in each of the pair of supply regions, and wherein the processing liquid in the container supported by the supporter is supplied to the substrate processing apparatus via the connection pipe.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a side view schematically showing the internal configuration of the processing liquid supply apparatus of FIG. 1.

FIG. 11 is a diagram showing the internal state of the processing liquid supply apparatus of FIG. 1 during replacement of a bottle.

FIG. 12 is a diagram showing the internal state of the processing liquid supply apparatus of FIG. 1 during replacement of a bottle.

FIG. 13 is a diagram showing the internal state of the processing liquid supply apparatus of FIG. 1 during replacement of a bottle.

FIG. 14 is a diagram showing the internal state of the processing liquid supply apparatus of FIG. 1 during replacement of a bottle.

DETAILED DESCRIPTION

Figure 1:
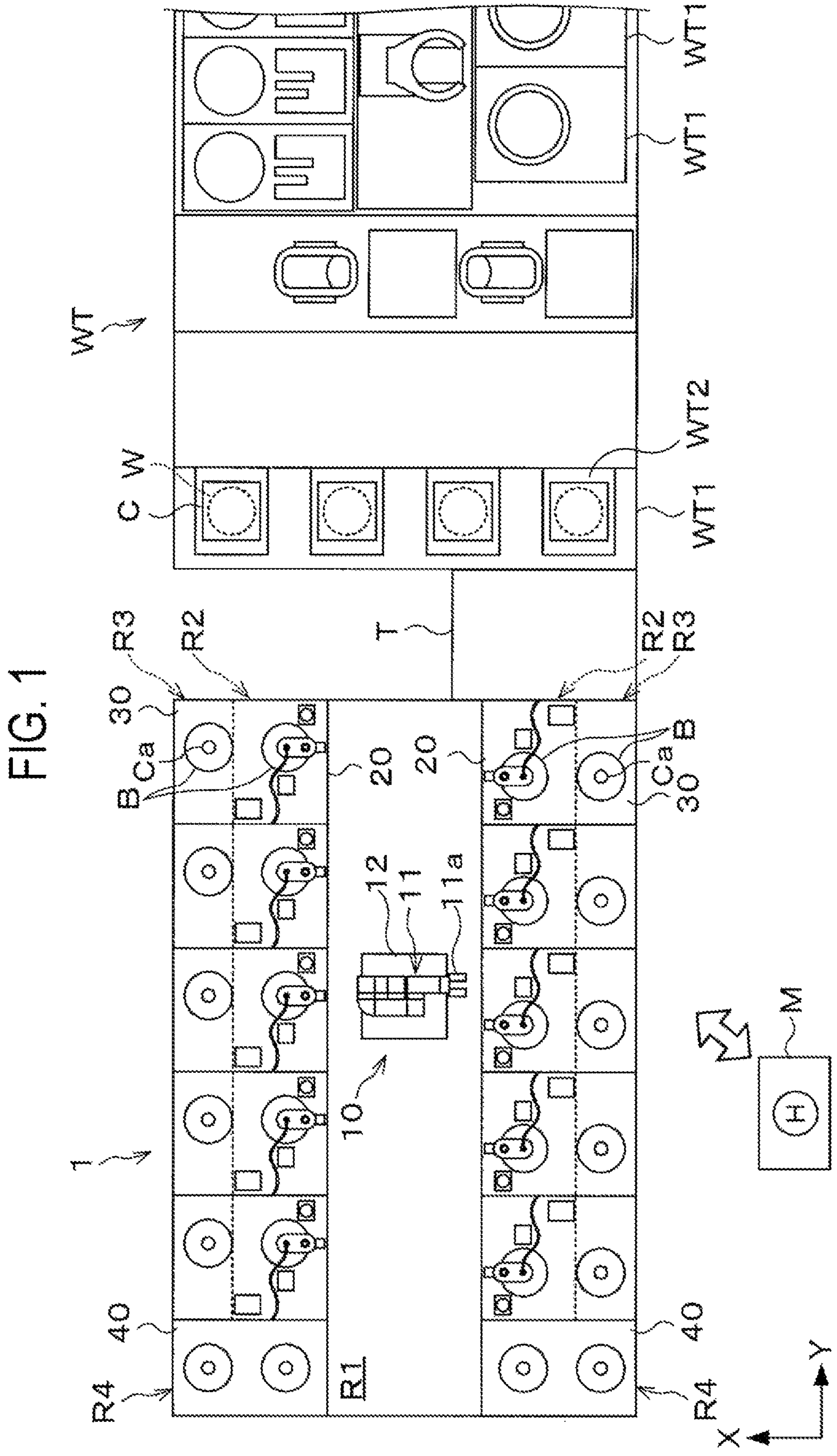
FIG. 1 is a plan view schematically showing an internal configuration of a processing liquid supply apparatus according to a first embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a manufacturing process of a semiconductor device or the like, various liquid processing processes are performed to form a resist film by coating a resist solution on a substrate such as a semiconductor wafer (hereinafter referred to as a "wafer") or to develop the resist film by supplying a developing solution. These liquid processing processes are performed by a substrate processing apparatus equipped with various liquid processing modules, a transfer mechanism for transferring the substrate between modules, and the like.

Some of various processing liquids used in such a substrate processing apparatus is supplied to each liquid processing module from, for example, a container for storing a processing liquid, disposed in the substrate processing apparatus. Alternatively, a processing liquid container may be accommodated in an external processing liquid supply apparatus provided outside the substrate processing apparatus, and the processing liquid may be supplied from the external processing liquid supply apparatus to the substrate processing apparatus (see Patent Document 1). However, when the processing liquid is supplied from the external processing liquid supply apparatus in this way, there is room for improvement in terms of usability.

Therefore, a technique according to the present disclosure improves usability at the time of supplying a processing liquid from the outside to a substrate processing apparatus.

Hereinafter, a processing liquid supply apparatus and a processing liquid supply method according to the embodiment will be described with reference to the drawings. In this specification, elements having substantially the same functional configuration are denoted by the same reference numerals and redundant descriptions thereof will be omitted.

First Embodiment

<Processing Liquid Supply Apparatus>

Figure 2:
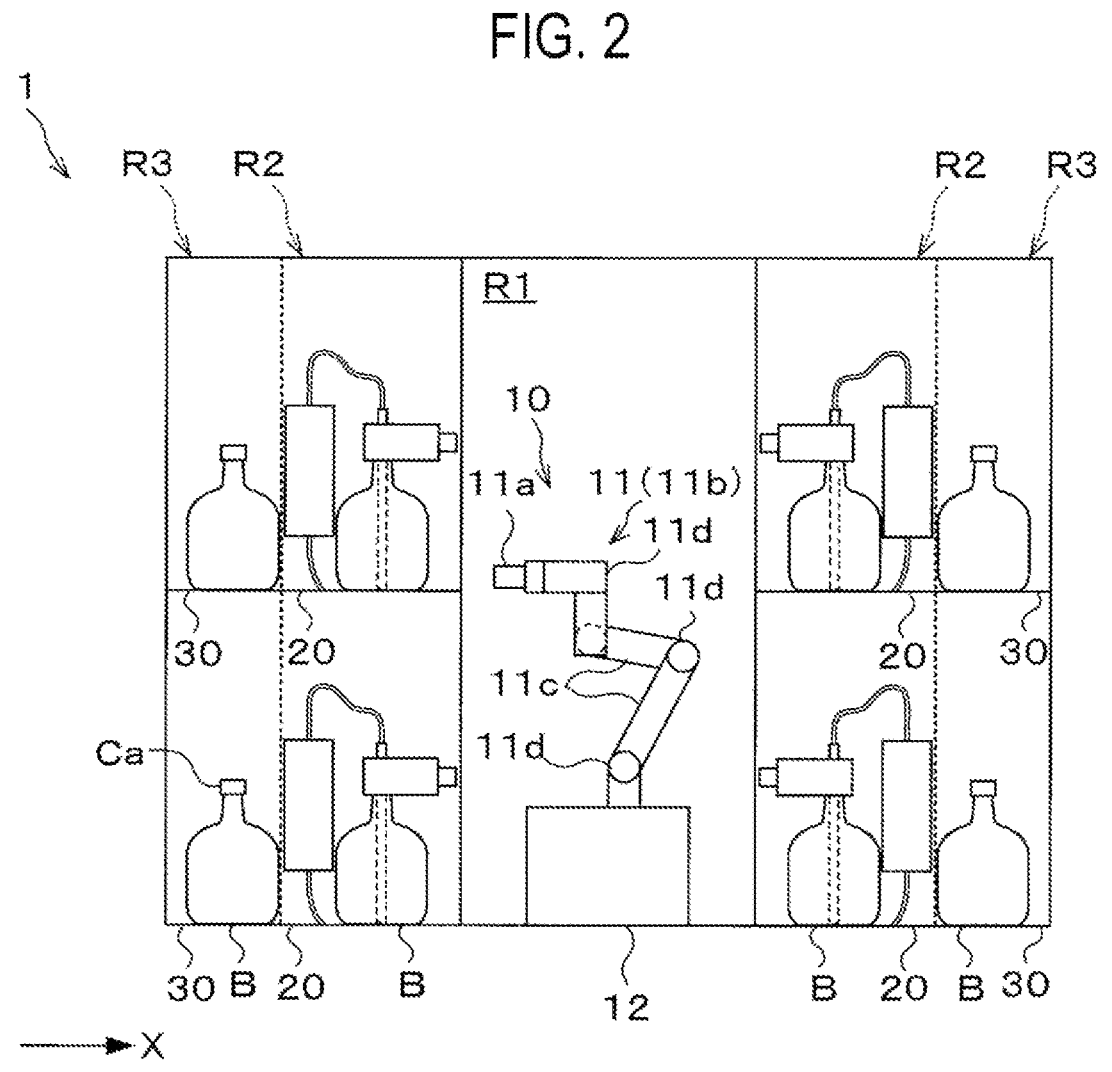
Figure 3:
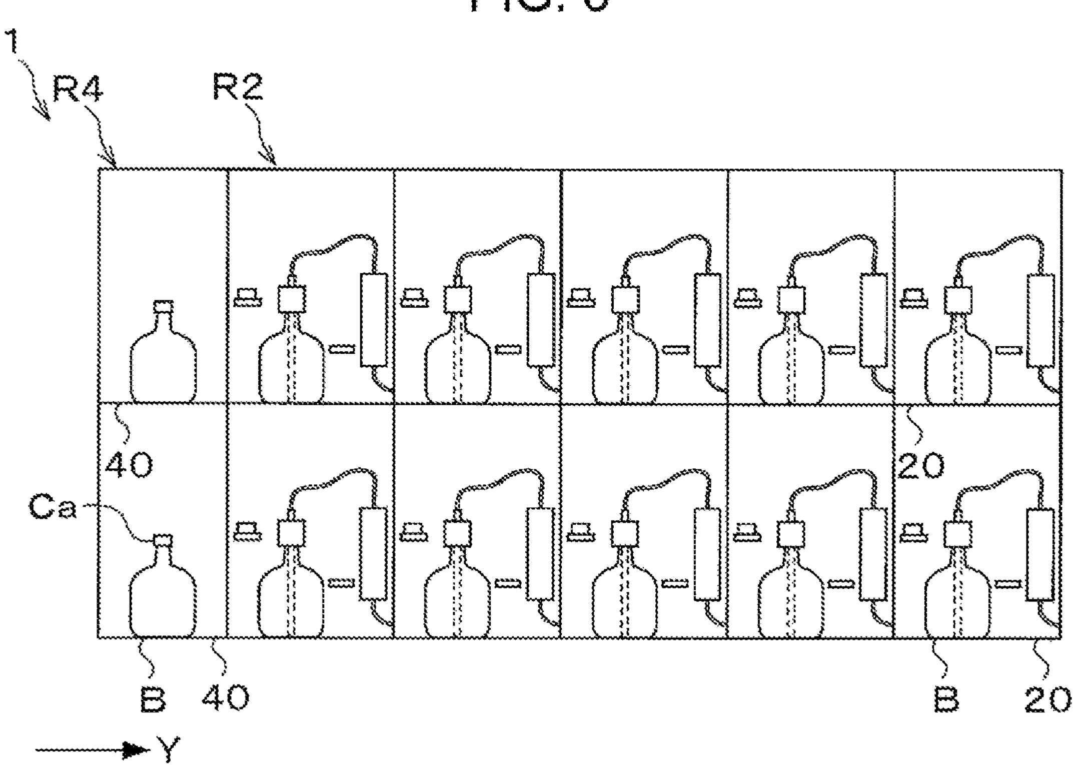
FIG. 3 is a front view schematically showing the internal configuration of the processing liquid supply apparatus of FIG. 1.

FIG. 1 is a plan view schematically showing an internal configuration of a processing liquid supply apparatus according to a first embodiment. FIG. 2 is a side view schematically showing the internal configuration of the processing liquid supply apparatus of FIG. 1. FIG. 3 is a front view schematically showing the internal configuration of the processing liquid supply apparatus of FIG. 1.

A processing liquid supply apparatus 1 of FIG. 1 supplies a processing liquid to a wafer processing apparatus WT as a substrate processing apparatus. Specifically, for example, the processing liquid supply apparatus 1 supplies the processing liquid to the wafer processing apparatus WT from an outside of the wafer processing apparatus WT via a relay device T. The processing liquid supply apparatus 1 may supply the processing liquid from one processing liquid supply apparatus 1 to a plurality of wafer processing apparatuses WT. The processing liquid supplied from the processing liquid supply apparatus 1 is a processing liquid for semiconductor manufacturing, and specifically includes, for example, a resist liquid, a developing liquid, and a processing liquid for forming other films other than a resist film.

The wafer processing apparatus WT is a semiconductor manufacturing device, and specifically includes, for example, a coating-developing apparatus, an apparatus that performs only either coating or development, a cleaning apparatus, and the like. The wafer processing apparatus WT includes a liquid processing module WT1 that processes a wafer W using the processing liquid. Specifically, the wafer processing apparatus WT includes a plurality of liquid processing modules WT1. The wafer processing apparatus WT also includes a cassette stage WT2 on which a cassette C, which is a container configured to accommodate a plurality of wafers W, is placed.

The relay device T includes, for example, a processing liquid flow path (not shown) that connects the processing liquid supply apparatus 1 to the wafer processing apparatus WT. A plurality of processing liquid flow paths may be provided. A buffer tank (not shown) may be provided in the processing liquid flow path to temporarily store the processing liquid fed forcibly from the processing liquid supply apparatus 1. Further, a pump (not shown) may be provided in in the processing liquid flow path to forcibly feed the processing liquid stored in the buffer tank to the wafer processing apparatus WT.

In one embodiment, the relay device T is disposed adjacent to and connected to the processing liquid supply apparatus 1. The wafer processing apparatus WT is disposed adjacent to and connected to the relay device T on an opposite side of the processing liquid supply apparatus 1. A portion at which the relay device T is connected to the wafer processing apparatus WT is, for example, the cassette stage WT2.

The relay device T may be provided inside the wafer processing apparatus WT.

As in the embodiment shown in FIG. 1, the processing liquid supply apparatus 1 may be provided with a housing (corresponding to an outer contour of the processing liquid supply apparatus 1) different from a housing (corresponding to an outer contour of the wafer processing apparatus WT) encompassing a transfer space for the wafer W and a liquid processing module in the wafer processing apparatus WT. That is, the processing liquid supply apparatus 1 may be provided separately from the wafer processing apparatus WT, without being stacked vertically together with the wafer processing apparatus WT. Further, in the example of FIG. 1, since the processing liquid supply apparatus 1 and the wafer processing apparatus WT are connected to each other by the relay device T, the processing liquid supply apparatus 1 may be considered to be connected to the wafer processing apparatus WT by the processing liquid flow path. The processing liquid supply apparatus 1 may be installed on a floor of an installation space (a clean room) in which the wafer processing apparatus WT is installed or may be provided in an installation space (e.g., a sub-fab space below the clean room), which is different from the wafer processing apparatus WT, by using the processing liquid flow path instead of the relay device T.

The processing liquid supply apparatus 1 has a transfer region R1 and a pair of supply regions R2.

One transfer mechanism 10 is provided in the transfer region R1 to hold and transfer a bottle B serving as a container in which the processing liquid is stored. The transfer region R1 is provided to extend in an apparatus width direction (Y direction in the figure).

The transfer mechanism 10 includes an articulated robot 11 and a pedestal portion 12. The articulated robot 11 is, for example, a vertical articulated robot.

As shown in FIG. 2, the articulated robot 11 includes a hand **11*a* and an articulated arm 11*b***.

The hand **11*a*** is a holder that holds at least the bottle B.

The articulated arm **11*b* is an arm configured to rotate the hand 11*a* and move the hand 11*a* around a central axis of the hand 11*a* along which the hand 11*a* extends. For example, the hand 11*a* is connected to a tip of the articulated arm 11*b*. The articulated arm 11*b* includes a plurality of (two in the illustrated example) links 11*c* and a plurality of (three in the illustrated example) joints 11*d***.

The hand 11*a* and the link 11*c* at a tip side of the articulated arm 11*b*, the links 11*c*, and the link 11*c* at a base end side of the articulated arm 11*b* and the pedestal portion 12 are connected to each other to be relatively rotated or turned about a predetermined axis by the joints 11*d* so that the hand 11*a* rotates about the central axis of the hand 11*a* and moves three-dimensionally by the articulated arm 11*b*. An actuator for driving relative rotation about the predetermined axis is provided inside, for example, each joint 11*d* or the pedestal portion 12.

The pedestal portion 12 is configured to be movable in the apparatus width direction. Specifically, the pedestal portion 12 is configured to be movable, for example, along a rail (not shown) extending in the apparatus width direction. An actuator that drives movement of the pedestal portion 12 is provided inside, for example, the pedestal portion 12.

The transfer mechanism 10 holds and transfers the bottle B with the hand 11*a* of the articulated robot 11. Further, the articulated robot 11 may hold a lid of the bottle B (that is, a cap Ca) with the hand 11*a* to open and close the cap Ca. Specifically, the articulated robot 11 may hold the cap Ca of the bottle B with the hand 11*a* and open and close the cap Ca by rotating the cap Ca around the central axis of the hand 11*a*, which is parallel to a vertical axis. The cap Ca is of a screw type, for example. When the cap Ca is closed, an opening of the bottle B is hermetically closed (that is, sealed).

Further, the articulated robot 11 may attach and detach a connection pipe 22*a* (to be described later) to and from the bottle B using the hand 11*a*. Further, the articulated robot 11 may open and close a pipe-mounted cap 22*b* (to be described later) by rotating the pipe-mounted cap 22*b* using the hand 11*a*.

The transfer mechanism 10 is controlled by a controller M described later. Specifically, an actuator that drives the operation of the transfer mechanism 10 is controlled by the controller M.

As shown in FIG. 1, the pair of supply regions R2 faces each other via the transfer region R1 in a plan view.

A supply stage 20 is provided in each of the pair of supply regions R2 as a supporter which supports the bottle B loaded from an outside of the processing liquid supply apparatus 1. A plurality of supply stages 20 is provided for each supply region R2 to be arranged in an apparatus depth direction (Y direction in FIG. 1). Further, as shown in FIGS. 2 and 3, the plurality of supply stages 20 may be provided to be arranged in an apparatus height direction (vertical directions in FIGS. 2 and 3), that is, may be stacked in multiple stages.

Further, as shown in FIGS. 1 and 2, the processing liquid supply apparatus 1 further has a waiting region R3 into which the bottle B is loaded from the outside of the processing liquid supply apparatus 1 and in which the bottle B waits before being transferred to the supply region R2. The waiting region R3 is provided separately from the supply region R2.

In one embodiment, the waiting region R3 is provided for every supply region R2. Each waiting region R3 is provided adjacent to the supply region R2 on a side opposite to the transfer region R1.

A loading stage 30 is provided in each waiting region R3 as another supporter which supports the bottle B loaded from the outside of the processing liquid supply apparatus 1. The loading stage 30 is provided for every supply stage 20. The bottle B, which is loaded into the processing liquid supply apparatus 1 and placed on the loading stage 30 while being supported by the loading stage 30, is gripped by, for example, the hand 11*a*, and is transferred to the corresponding supply stage 20 by the articulated robot 11. Further, the transfer of the bottle B from the outside of the processing liquid supply apparatus 1 to the loading stage 30 is performed by an external device of the processing liquid supply apparatus 1 or by an operator. The loading of the bottle B into the waiting region R3 from the outside of the processing liquid supply apparatus 1 is performed from a side opposite to the supply region R2.

In the illustrated example, one bottle B has been described to be placed on each loading stage 30, but a plurality of bottles B may be placed on each loading stage 30.

As shown in FIGS. 1 and 3, the processing liquid supply apparatus 1 has a recovery region R4 in which the bottle B unloaded from the supply region R2 by the transfer mechanism 10 waits until being unloaded to the outside of the processing liquid supply apparatus 1. The recovery region R4 is provided separately from the supply region R2. Specifically, the processing liquid supply apparatus 1 has the recovery region R4 separately from the supply region R2 and the waiting region R3.

In one embodiment, the recovery region R4 is provided for every supply region R2. In other words, the processing liquid supply apparatus 1 has a pair of recovery regions R4.

The pair of recovery regions R4 faces each other via, for example, the transfer region R1 in a plan view.

Further, each of the recovery regions R4 is provided at, for example, an end portion of the processing liquid supply apparatus 1 on a side opposite to the wafer processing apparatus WT. This makes it possible to suppress maintenance of the wafer processing apparatus WT disposed near the processing liquid supply apparatus 1 from being degraded by the recovery region R4. That is, by providing each of the recovery regions R4 at the end portion of the processing liquid supply apparatus 1 on the side opposite to the wafer processing apparatus WT, it is possible to easily utilize the recovery region R4 compared to the case in which the recovery region R4 is provided at the end portion of the processing liquid supply apparatus 1 on the side of the wafer processing apparatus WT.

A recovery stage 40 is provided in each of the recovery regions R4 as another supporter which supports the bottle B unloaded from the supply region R2 by the transfer mechanism 10. Each of the recovery stages 40 is provided to extend, for example, in an apparatus depth direction (X direction in the figure). One recovery stage 40 may be provided in the recovery region R4 to be arranged in the apparatus width direction (Y direction in the figure). Further, like the supply stages 20, a plurality of recovery stages 40 may be stacked in multiple stages. In this case, the number of stacked recovery stages 40 and the number of stacked supply stages 20 may be identical to each other.

The bottle B placed and supported on the recovery stage 40 is unloaded and recovered by a device outside the processing liquid supply apparatus 1 or by an operator.

The recovery stage 40 may be configured such that the bottle B moves on the recovery stage 40. Specifically, the bottle B may be moved away from the transfer region R1 by a transfer roller (not shown) provided on the recovery stage 40. Alternatively, the recovery stage 40 may be tilted with respect to a horizontal plane and the bottle B may be moved away from the transfer region R1 on the recovery stage 40 by gravity acting on the bottle B.

Further, the processing liquid supply apparatus 1 further includes the controller M which controls the processing liquid supply apparatus 1. The controller M is, for example, a computer equipped with a processor, such as a CPU, and a memory, and includes a program storage (not shown). The program storage stores a program incorporating an instruction for executing the supply of the processing liquid by the processing liquid supply apparatus 1 or a program incorporating an instruction for executing the replacement of the bottle by the processing liquid supply apparatus 1. The above program may be stored in, for example, a computer-readable storage medium H, and may be installed in the controller M from the storage medium H. The storage medium H may be a transitory or non-transitory medium.

In the illustrated example, a portion excluding the recovery region R4 from a portion on a front side (negative side of an X direction in the figure) of the transfer region R1 of the processing liquid supply apparatus 1 is divided in the apparatus height direction and the apparatus width direction to form small blocks. Each small block is divided by a frame body. The supply stage 20 and the loading stage 30 are provided inside each small block. Similarly, a portion excluding the recovery region R4 from a portion on a back side (positive side of the X direction in the figure) of the transfer region R1 of the processing liquid supply apparatus 1 is divided in the apparatus height direction and the apparatus width direction to form small blocks. Each small block is partitioned by a frame body. The supply stage 20 and the loading stage 30 are provided inside each small block.

<Supply Region R2>

Figure 4:
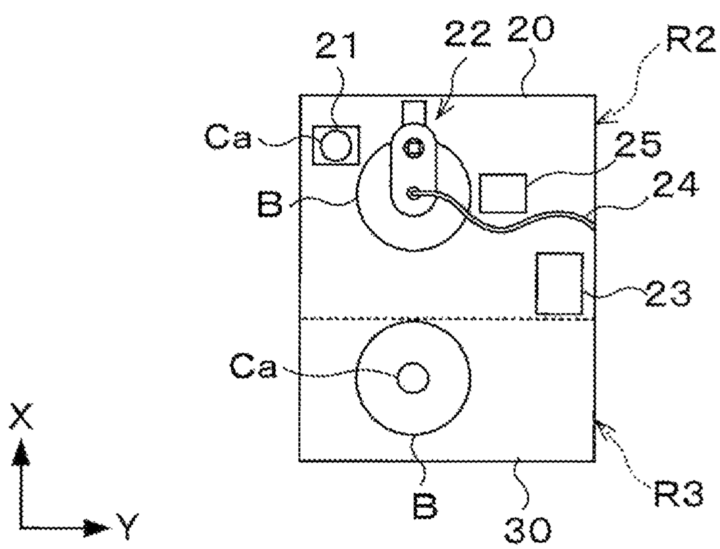
FIG. 4 is a partially enlarged plan view of a supply region and a waiting region.
Figure 5:
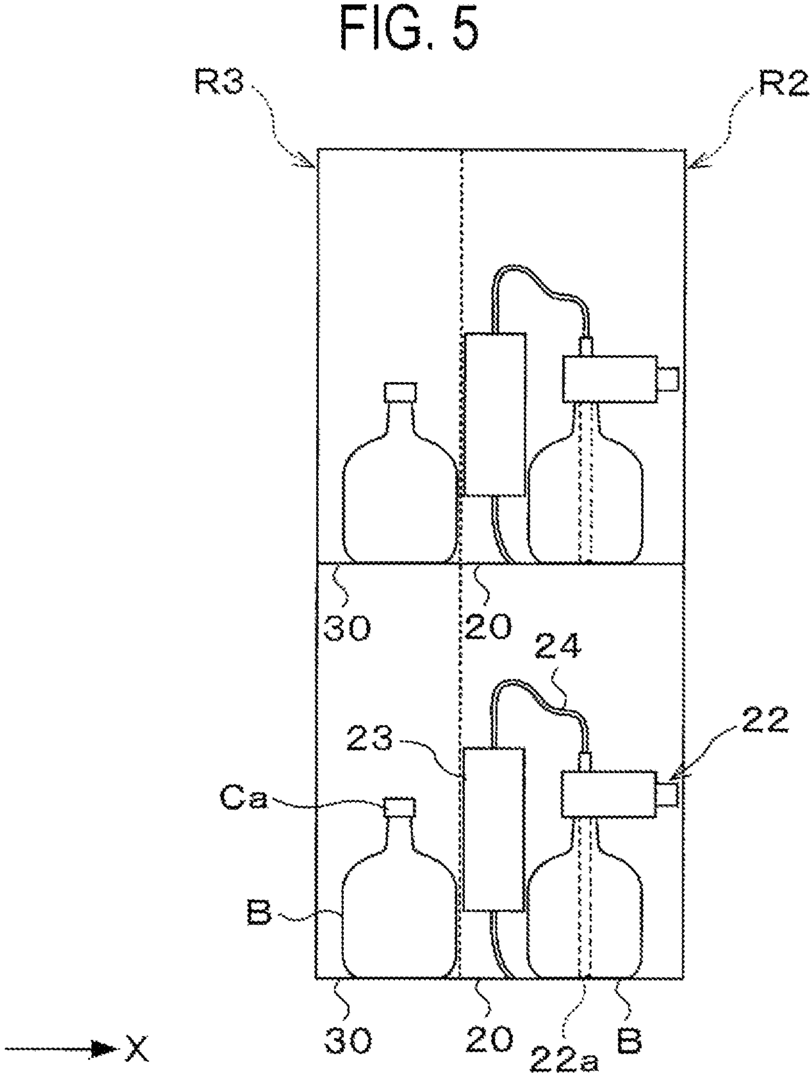
FIG. 5 is a partially enlarged side view of the supply region and the waiting region.
Figure 6:
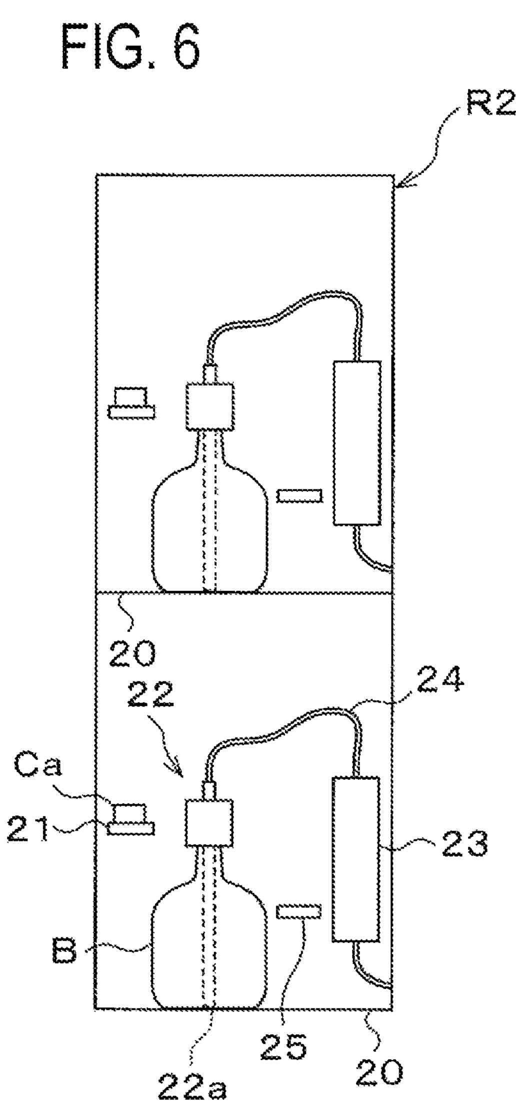
FIG. 6 is a partially enlarged front view of the supply region and the waiting region.
Figure 7:
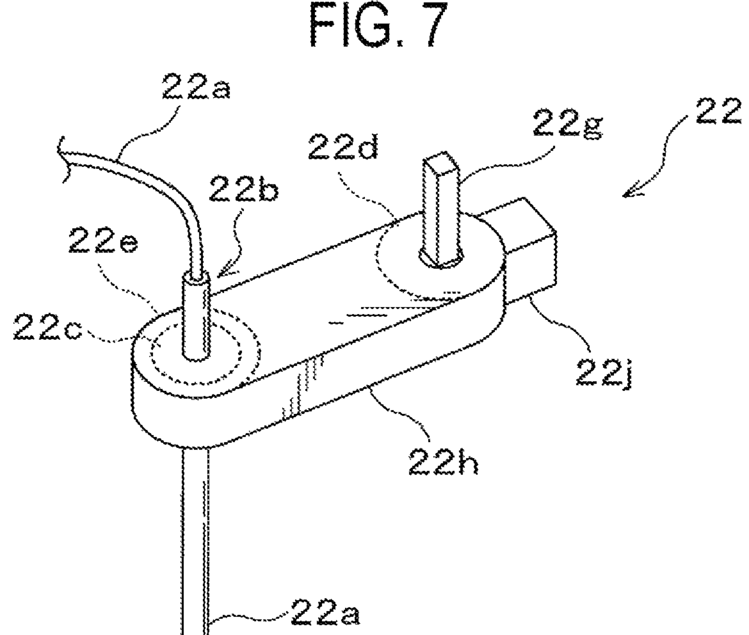
FIG. 7 is a perspective view of a connection pipe unit in a state in which a cover is attached to the connection pipe unit.
Figure 8:
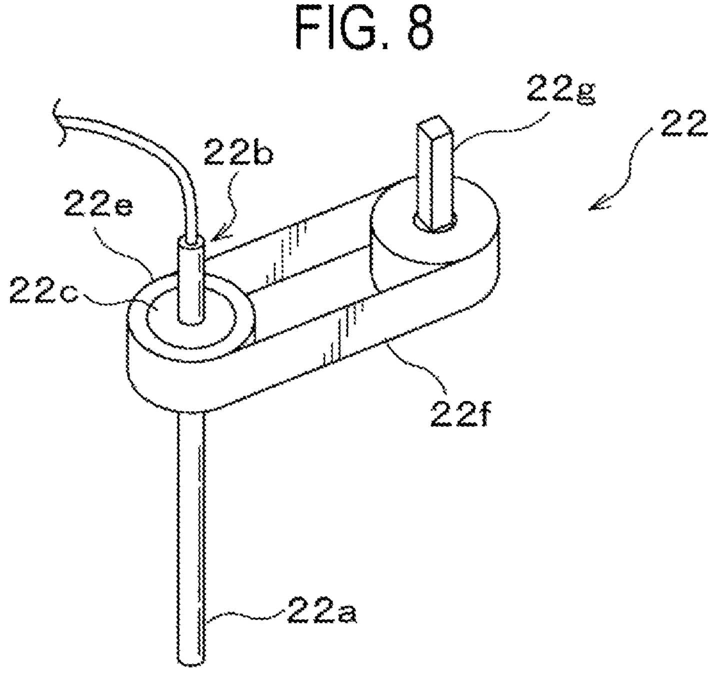
FIG. 8 is a perspective view of the connection pipe unit in a state in which the cover is removed from the connection pipe unit.

Next, a more detailed configuration in the supply region R2 will be described with reference to FIGS. 4 to 8. FIGS. 4 to 6 are a partially enlarged plan view, a partially enlarged side view, and a partially enlarged front view of the supply region R2 and the waiting region R3, respectively. FIGS. 7 and 8 are perspective views of a connection pipe unit 22, which will be described later. FIG. 7 shows the connection pipe unit 22 in a state in which a cover 22*h* (to be described later) is attached to the connection pipe unit 22, and FIG. 8 shows the connection pipe unit 22 in a state in which the cover 22*h* is removed from the connection pipe unit 22.

As shown in FIGS. 4 to 6, a cap stage 21 and the connection pipe unit 22 are provided for every supply stage 20 in each supply region R2.

The cap Ca removed from the bottle B is placed on the cap stage 21 until the cap Ca returns to its original bottle B.

As shown in FIGS. 7 and 8, the connection pipe unit 22 includes the connection pipe 22*a* which is connected to the bottle B placed and supported on the supply stage 20. Specifically, the connection pipe unit 22 includes the pipe-mounted cap 22*b* as another lid which supports the connection pipe 22*a*. By attaching the pipe-mounted cap 22*b* to the bottle B instead of the cap Ca, the connection pipe 22*a* is connected to the bottle B.

The pipe-mounted cap 22*b* includes a cap body 22*c* into which the connection pipe 22*a* is inserted and attached to the bottle B, in addition to the connection pipe 22*a*. The cap body 22*c* supports the connection pipe 22*a* inserted therethrough so as to rotate independently of the connection pipe 22*a*. The pipe-mounted cap 22*b* is of, for example, a screw type. When the pipe-mounted cap 22*b* is closed, the opening of the bottle B is sealed.

The connection pipe unit 22 also includes a first roller 22*d*, a second roller 22*e*, and a belt 22*f*.

The first roller 22*d* is configured to be rotatable, and specifically is configured to be rotatable around a vertical axis passing through a center of the first roller 22*d*. A stick 22*g* serving as a rotational shaft is attached to the center of the first roller 22*d* so as to extend in a vertical direction. The stick 22*g* is attached to the first roller 22*d* so as to pass through the first roller 22*d*. The stick 22*g* is rotated around the central axis of the stick 22*g* by the hand 11*a*, so that the first roller 22*d* is rotated around the vertical axis passing through the center of the first roller 22*d*.

The stick 22*g* is formed in, for example, a column shape. Specifically, an upper portion of the stick 22*g* is gripped by the hand 11*a* and is formed in, for example, a square column shape, and a lower portion thereof passes through the first roller 22*d* and is formed in a cylindrical shape.

Similar to the first roller 22*d*, the second roller 22*e* rotates around the vertical axis passing through a center of the second roller 22*e* with the rotation of the first roller 22*d*. The second roller 22*e* is fixed to the pipe-mounted cap 22*b*. Therefore, as the second roller 22*e* rotates, the pipe-mounted cap 22*b* (specifically, the cap body 22*c*) rotates around the vertical axis passing through the center of the second roller 22*e*. Thus, the pipe-mounted cap 22*b* is open and closed.

The belt 22*f* transmits a rotational motion of the first roller 22*d* to the second roller 22*e* to rotate the second roller 22*e*. Teeth (not shown) for power transmission may be formed on an inner circumferential surface of the belt 22*f*, an outer circumferential surface of the first roller 22*d*, and an outer circumferential surface of the second roller 22*e*.

Further, the connection pipe unit 22 includes the cover 22*h* and a grip portion 22*j*.

The cover 22*h* collectively covers the cap body 22*c*, the first roller 22*d*, the second roller 22*e*, and the belt to package and unitize them.

The grip portion 22*j* is gripped by the hand 11*a* when the connection pipe unit 22 is moved by the articulated robot 11. The grip portion 22*j* may be fixed to the cover 22*h* to be formed integrally with the cover 22*h*.

As shown in FIGS. 4 to 6, a tank 23, a pipe 24, and a liquid receiver 25 are provided for every supply stage 20 in each supply region R2.

The tank 23 temporarily stores the processing liquid fed forcibly from the bottle B via the connection pipe 22*a*. The processing liquid in the tank 23 is forcibly fed to, for example, the relay device T. Specifically, the processing liquid in the tank 23 is transferred to the relay device T via, for example, the pipe 24 connected to the tank 23.

The pipe 24 connects the connection pipe 22*a* and the tank 23.

The liquid receiver 25 receives the processing liquid dripped from the connection pipe 22*a* not connected to the bottle B.

<Supply of Processing Liquid>

Next, an example of the supply of the processing liquid from the processing liquid supply apparatus 1 will be described. Each of the following processes is performed under the control of the controller M.

For example, gas is first supplied into the bottle B on the supply stage 20 from a pressurized gas source (not shown). As a result, the processing liquid in the bottle B is forcibly fed to the tank 23.

An air supply pipe (not shown) for supplying the gas from the pressurized gas source into the bottle B may be attached to the pipe-mounted cap 22*b*.

Subsequently, the gas is supplied to the tank 23 from the pressurized gas source (not shown). As a result, the processing liquid in the tank 23 is forcibly fed to the relay device T via the pipe 24 or to the processing liquid supply apparatus 1.

<Replacement of Bottle>

Next, an example in which the processing liquid supply apparatus 1 replaces the bottle B in use with a new one will be described with reference to FIGS. 9 to 16. FIGS. 9 to 16 are diagrams showing an internal state of the processing liquid supply apparatus during the replacement of the bottle. Each process below is performed under the control of the controller M.

(Step S1)

For example, first, the pipe-mounted cap 22*b* attached to the empty bottle B in the supply region R2 is open by the articulated robot 11 of the transfer mechanism 10.

Specifically, the stick 22*g* of the connection pipe unit 22 is held and rotated by the hand 11*a* to open the pipe-mounted cap 22*b*.

Figure 9:
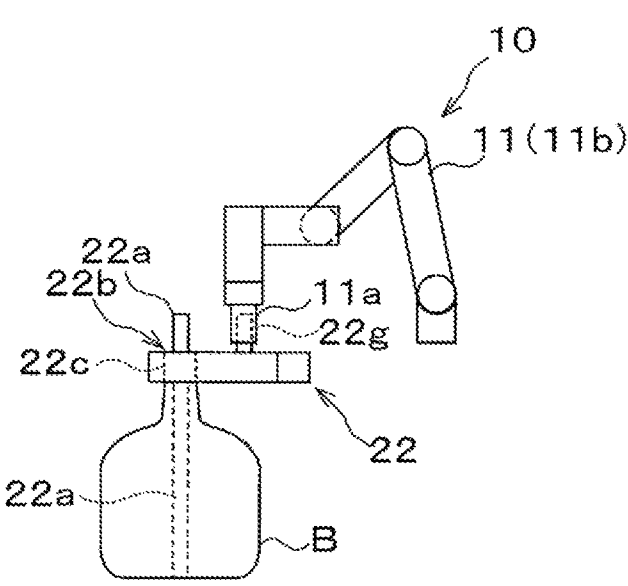
FIG. 9 is a diagram showing an internal state of the processing liquid supply apparatus of FIG. 1 during replacement of a bottle.

More specifically, as shown in FIG. 9, the stick 22*g* of the connection pipe unit 22 attached to the empty bottle B in the supply region R2 is gripped from above by the hand 11*a*. Thereafter, the hand 11*a* is rotated around the central axis of the hand 11*a*, which is parallel to the vertical axis. Thus, the first roller 22*d* rotates around the vertical axis passing through the center of the first roller 22*d*. As a result, the second roller 22*e* and the cap body 22*c* rotate around the vertical axis passing through the center of the second roller 22*e*, so that the pipe-mounted cap 22*b* of the empty bottle B is open.

(Step S2)

Subsequently, the connection pipe 22*a* attached to the empty bottle B is extracted from the empty bottle B.

Figure 10:
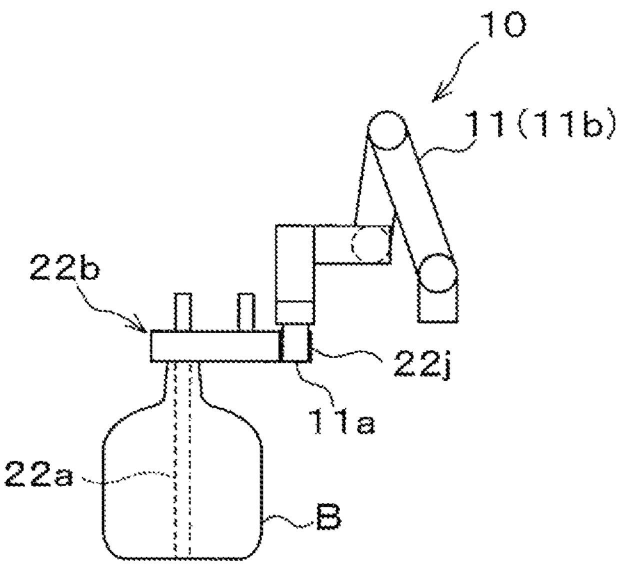
FIG. 10 is a diagram showing the internal state of the processing liquid supply apparatus of FIG. 1 during replacement of a bottle.
Figures 11, 12, 13, 14:
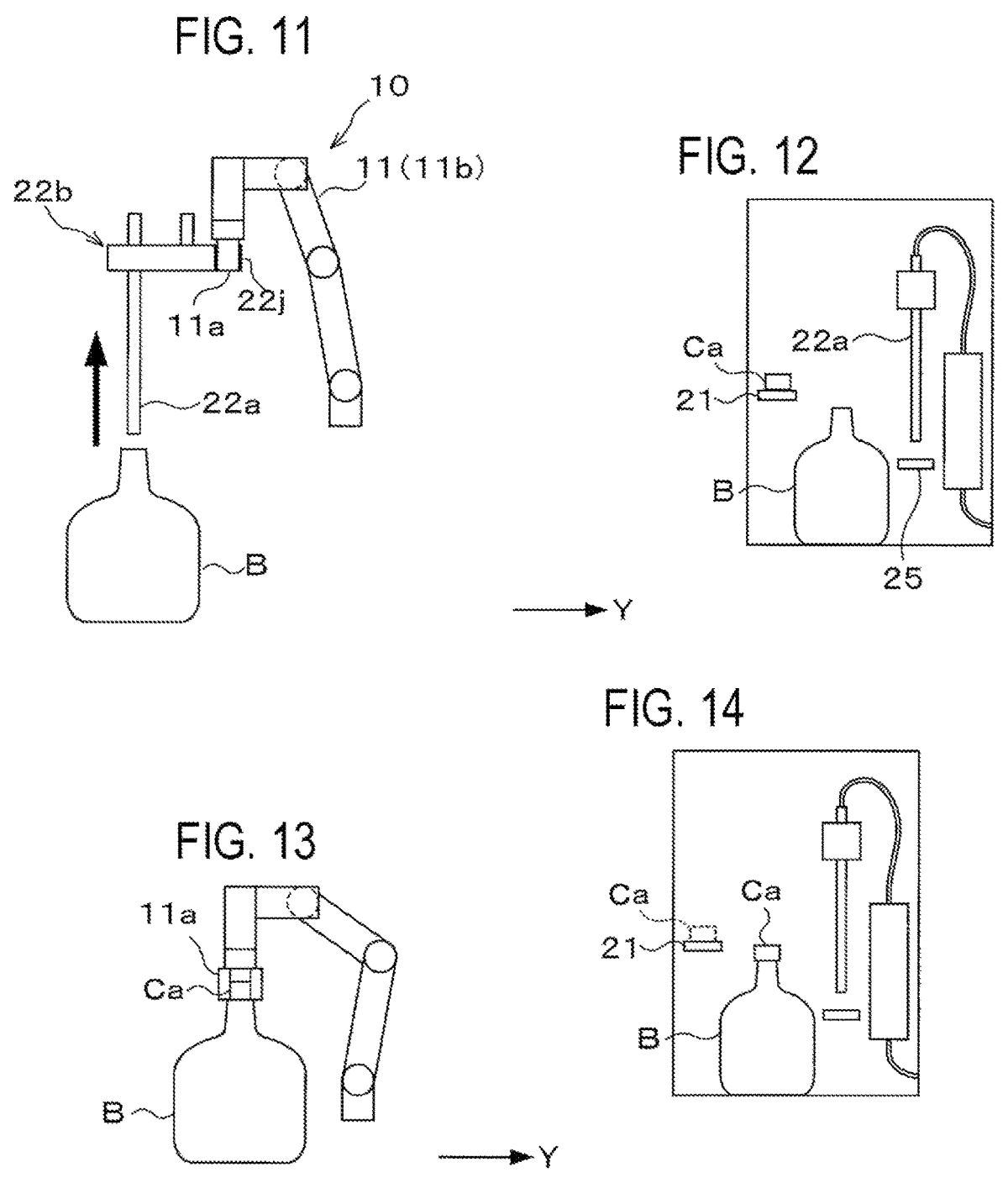

Specifically, as shown in FIG. 10, the grip portion 22*j* of the connection pipe unit 22 is gripped from above by the hand 11*a*. Thereafter, as shown in FIG. 11, the hand 11*a* is raised by the articulated arm 11*b*. As a result, the connection pipe 22*a* is pulled out from the empty bottle B. Thereafter, as shown in FIG. 12, the hand 11*a* is moved and the connection pipe unit 22 is moved so that the connection pipe 22*a* is positioned above the liquid receiver 25. After such movements, the connection pipe unit 22 is supported by a support member (not shown).

(Step S3)

Subsequently, the cap Ca closes the empty bottle B by the articulated robot 11. Specifically, the cap Ca is held and rotated by the hand 11*a* to close the empty bottle B.

More specifically, first, the cap Ca placed on the cap stage 21 is gripped from above by the hand 11*a*. Thereafter, as shown in FIG. 13, the hand 11*a* gripping the cap Ca is moved so that the cap Ca covers the opening of the empty bottle B. Then, the hand 11*a* is rotated about the central axis of the hand 11*a*, which is parallel to the vertical axis. Thus, the cap Ca is rotated in the same manner as the hand 11*a*. As a result, as shown in FIG. 14, the cap Ca placed on the cap stage 21 closes the empty bottle B.

(Step S4)

Thereafter, the empty bottle B is transferred from the supply region R2 to the recovery region R4 by the articulated robot 11.

Figures 15, 16, 17:
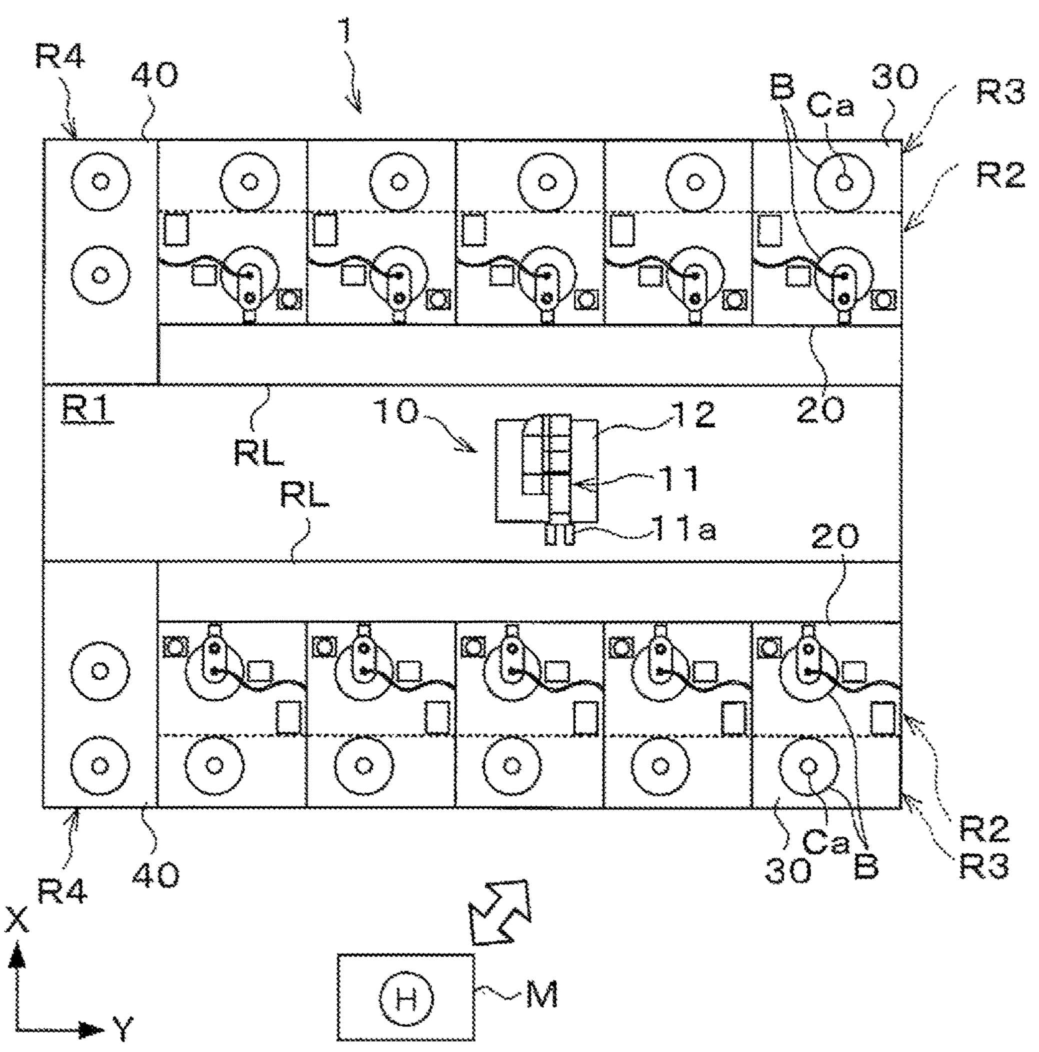
FIG. 15 is a diagram showing the internal state of the processing liquid supply apparatus of FIG. 1 during replacement of a bottle.
FIG. 16 is a diagram showing the internal state of the processing liquid supply apparatus of FIG. 1 during replacement of a bottle.
FIG. 17 is a plan view schematically showing an internal configuration of a processing liquid supply apparatus according to a second embodiment.

Specifically, first, as shown in FIG. 15, a neck portion of the empty bottle B on the supply stage 20 is gripped from the side by the hand 11*a*. In this state, the hand 11*a* is moved and the empty bottle B placed on the supply stage 20 is placed on the recovery stage 40.

(Step S5)

Subsequently, a new bottle B is transferred from the waiting region R3 to the supply region R2 by the articulated robot 11.

Specifically, first, a neck portion of the new bottle B on the loading stage 30 is gripped from the side by the hand 11*a*. In this state, the hand 11*a* is moved, and as shown in FIG. 16, the new bottle B placed on the loading stage 30 is placed on the supply stage 20.

(Step S6)

Thereafter, a cap Ca of the new bottle B is open by the articulated robot 11. Specifically, the cap Ca of the new bottle B is held and rotated by the hand 11*a* and is open.

More specifically, first, the cap Ca of the new bottle B is gripped from above by the hand 11*a*. Subsequently, the hand 11*a* is rotated about the central axis of the hand 11*a*, which is parallel to the vertical axis. Thus, the cap Ca is rotated in the same manner as the hand 11*a*. As a result, the cap Ca of the new bottle B is open. Thereafter, the hand 11*a* gripping the cap Ca is moved, and the cap Ca is placed on the cap stage 21.

(Step S7)

Subsequently, the connection pipe 22*a* is inserted into the new bottle B.

Specifically, the grip portion 22*j* of the connection pipe unit 22 located near an upper portion of the liquid receiver 25 is gripped from above by the hand 11*a*. Thereafter, the hand 11*a* gripping the connection pipe unit 22 is moved so that the connection pipe 22*a* is positioned above the liquid receiver 25. Thereafter, the hand 11*a* is lowered. As a result, the connection pipe 22*a* is inserted into the new bottle B, and the pipe-mounted cap 22*b* covers an opening of the new bottle B.

(Step S8)

Then, the pipe-mounted cap 22*b* closes the new bottle B by the articulated robot 11 of the transfer mechanism 10.

Specifically, the stick 22*g* of the connection pipe unit 22 is held and rotated by the hand 11*a*, so that the pipe-mounted cap 22*b* closes the new bottle B. More specifically, the stick 22*g* of the connection pipe unit 22 having the pipe-mounted cap 22*b* covering the new bottle B in the supply region R2 is gripped from above by the hand 11*a*. Thereafter, the hand 11*a* is rotated about the central axis of the hand 11*a*, which is parallel to the vertical axis. Thus, the first roller 22*d* rotates around the vertical axis passing through the center of the first roller 22*d*. As a result, the second roller 22*e* and the cap body 22*c* rotate about the vertical axis passing through the center of the second roller 22*e*, and the pipe-mounted cap 22*b* closes the new bottle B.

(Step S9)

In addition, the waiting region R3 is replenished with the bottle B.

The replenishment of the waiting region R3 with the bottle B is performed, for example, in parallel with steps S6 to S8 described above. The transfer of the bottle B from the outside of the processing liquid supply apparatus 1 to the loading stage 30 in the waiting region R3 is performed by, for example, a device outside the processing liquid supply apparatus 1.

(Step S10)

In addition, the bottle B that has been used is also recovered from the recovery region R4.

The recovery of the used bottle B from the recovery region R4 is performed, for example, in parallel with steps S6 to S8 described above. The recovery of the used bottle B from the recovery region R4 is performed by, for example, the device outside the processing liquid supply apparatus 1.

<Main Effects>

As described above, the processing liquid supply apparatus 1 according to the embodiment includes the transfer region R1 in which the transfer mechanism 10 holding and transferring the bottle B is provided and the pair of transfer regions R2 facing each other via the transfer region R1 in a plan view. Therefore, the bottle B in the supply region R2 may be replaced automatically by the transfer mechanism 10 without relying on an operator, which improves usability.

Further, since the pair of supply regions R2 is provided to face each other via the transfer region R1 in a plan view, the transfer mechanism 10 used for replacement of the bottle B may be shared between the supply regions R2. This eliminates a need to provide the transfer mechanism 10 for every supply region R2. That is, the bottle B in the supply region R2 may be replaced with a new one using a limited number of transfer mechanisms 10. From such a viewpoint, usability may be improved.

Further, in the embodiment, since the pair of supply regions R2 is provided, a large number of bottles B may be accommodated in the supply region R2 compared to the case in which one supply region R2 is provided. This makes it possible to simultaneously supply the processing liquid from the plurality of bottles B or to supply a specific type of processing liquid from any bottle selected from the plurality of bottles B. Further, the processing liquid may be supplied from one processing liquid supply apparatus 1 to a plurality of wafer processing apparatuses WT. From such a viewpoint, usability may be improved. In addition, since the transfer region R1 is used common to the supply regions R2, a footprint may be suppressed compared to the case in which the transfer region R1 is provided separately for every supply region R2. That is, according to the embodiment, it is possible to simultaneously supply the processing liquid from the plurality of bottles B, supply a specific type of processing liquid from any bottle selected from the plurality of bottles B, or supply the processing liquid from one processing liquid supply apparatus 1 to a plurality of wafer processing apparatuses WT, while suppressing an increase in footprint. A technique of simultaneously supplying the processing liquid from the plurality of bottles B is necessary in a recent situation where the number of liquid processing modules installed in the wafer processing apparatus WT is increasing.

Further, in the embodiment, the hand 11*a* of the articulated robot 11 holds and rotates the cap Ca of the bottle B to open and close the cap Ca. This eliminates a need to provide a configuration for rotating the cap Ca of the bottle B to open and close the cap Ca in the supply region R2. Therefore, an area of the supply region R2 in a plan view may be reduced, and the footprint of the processing liquid supply apparatus 1 may be further reduced. Further, there is no need to provide, in the supply region, the actuator for driving the rotation of the cap Ca of the bottle B, which leads to high costs. This makes it possible to improve usability of the processing liquid supply apparatus 1 while suppressing an increase in cost of the processing liquid supply apparatus 1.

In the embodiment, the pipe-mounted cap 22*b* provided with the connection pipe 22*a* is rotated by the hand 11*a* of the articulated robot 11 to open and close the pipe-mounted cap 22*b*. Therefore, in a configuration for rotating the pipe-mounted cap 22*b* to open and close the pipe-mounted cap 22*b*, there is no need to provide at least the actuator for driving the rotation of the pipe-mounted cap 22*b* in the supply region. Therefore, from this viewpoint as well, the usability of the processing liquid supply apparatus 1 may be improved while suppressing the increase in cost of the processing liquid supply apparatus 1.

Further, in the embodiment, the pipe-mounted cap 22*b* is configured to be open and closed by being rotated with the rotation of the stick 22*g*. In the embodiment, the pipe-mounted cap 22*b* is open and closed by holding and rotating the stick 22*g* by the hand 11*a*. Therefore, by rotating the pipe-mounted cap 22*b*, it is possible to suppress interference between the connection pipe 22*a* attached to the pipe-mounted cap 22*b* and the pipe 24 connected to the connection pipe 22*a*, and the articulated robot 11.

Second Embodiment

<Processing Liquid Supply Apparatus>

FIG. 17 is a plan view schematically showing an internal configuration of a processing liquid supply apparatus according to a second embodiment.

As shown in FIG. 17, a processing liquid supply apparatus 1A may further include a recovery line RL. The recovery line RL is loaded with a bottle B unloaded by the transfer mechanism 10 from a transfer region R1, that is, receives the bottle B. Then, the recovery line RL transfers the received bottle B to the recovery region R4. The transfer of the bottle B by the recovery line RL is performed, for example, by a conveyor (not shown) such as a transfer roller on which the bottle B is placed on the recovery line RL.

This recovery line RL is provided, for example, at a position between the transfer region R1 and a supply region R2 in a plan view.

By providing the recovery line RL as in the embodiment, time provided when the transfer mechanism 10 transfers the bottle B that has been used may be reduced. Therefore, while the used bottle B is being transferred by the transfer mechanism 10, it is possible to prevent other transfer by the transfer mechanism 10 from being interrupted.

When the supply stages 20 of the supply region R2 are provided in multiple stages and only one transfer mechanism 10 is provided, only one stage of the recovery line RL may be provided. Specifically, when supply stages 20 in the supply region R2 are provided in multiple stages, the recovery line RL may be provided only at the same height position as the supply stage 20 located at the lowest stage. This makes it possible to suppress an increase in costs.

Further, when the articulated robot 11 of the transfer mechanism 10 performs an operation on the bottle B placed on the upper supply stage 20, interference between the recovery line RL and the articulated robot 11 may be suppressed.

Modified Example

In the above example, while one transfer mechanism 10 has been provided in the transfer region R1, a plurality of transfer mechanisms 10 may be provided. For example, when the supply stages 20 are stacked in multiple stages as in the example shown in FIG. 2, the transfer mechanism 10 may be provided for every stage.

In the above example, while the connection pipe unit 22 has been provided with the grip portion 22*j*, the grip portion 22*j* may be omitted. In this case, when the connection pipe unit 22 is moved, the stick 22*g* is gripped, for example, by the hand 11*a* of the articulated robot 11.

In the above example, while transfer of the bottle B from the loading stage 30 to the supply stage 20 has been performed by the articulated robot 11, the following method may be used. That is, the transfer of the bottle B from the loading stage 3 to the supply stage 20 may be performed by a conveyance roller (not shown) provided on the loading stage 30. Alternatively, the loading stage 30 may be tilted with respect to the horizontal, and the transfer of the bottle B from the loading stage 30 to the supply stage 20 may be performed by gravity acting on the bottle B.

Further, in the above example, while both attachment and detachment of the cap Ca and the pipe-mounted cap 22*b* have been performed by the articulated robot 11, attachment and detachment of only one thereof may be performed by the articulated robot 11. In this case, it is desirable that only the attachment and detachment of the cap Ca be performed by the articulated robot 11.

In addition, the following configuration examples are also within the technical scope of the present disclosure.

(1). A processing liquid supply apparatus for supplying a processing liquid to a substrate processing apparatus having a liquid processing module that processes a substrate using the processing liquid, the processing liquid supply apparatus including:

a transfer region provided with a transfer mechanism configured to hold and transfer a container in which the processing liquid is stored; and a pair of supply regions facing each other via the transfer region, wherein each of the supply regions includes a supporter configured to support the container loaded from an outside of the processing liquid supply apparatus and a connection pipe connected to the container supported by the supporter, and wherein the processing liquid in the container supported by the supporter is supplied to the substrate processing apparatus via the connection pipe.

(2). The processing liquid supply apparatus as described in (1), wherein the processing liquid supply apparatus is provided on a floor separately from the substrate processing apparatus and is connected to the substrate processing apparatus by a processing liquid flow path.

(3). The processing liquid supply apparatus as described in (1), wherein the transfer mechanism includes a holder configured to hold at least the container and an arm configured so as to move the holder.

(4). The processing liquid supply apparatus as described in (3), further including a controller, wherein the controller is configured to control the holder to open and close the lid by holding a lid of the container.

(5). The processing liquid supply apparatus as described in (3) or (4), wherein the supply region is further provided with a rotational shaft configured to be rotatable and another lid of the container configured to support the connection pipe, and wherein the other lid is configured to be attached to the container so that the connection pipe is connected to the container and the other lid is open and closed by being rotated according to rotation of the rotational shaft, wherein the processing liquid supply apparatus further includes a controller, and wherein the controller is configured to control the holder to open and close the other lid by holding and rotating the rotational shaft.

(6). The processing liquid supply apparatus as described in any one of (1) to (6), further including a waiting region into which the container is loaded from the outside of the processing liquid supply apparatus and in which the container waits before being transferred to the supply region, the waiting region being provided separately from the supply region.

(7). The processing liquid supply apparatus as described in any one of (1) to (6), further including a recovery region where the container unloaded by the transfer mechanism from the supply region waits until being unloaded to the outside of the processing liquid supply apparatus, the recovery region being provided separately from the supply region.

(8). The processing liquid supply apparatus as described in (7), further including a recovery line configured to receive the container unloaded by the transfer mechanism from the transfer region and transfer the container to the recovery region.

(9). A processing liquid supply method of supplying a processing liquid to a substrate processing apparatus having a liquid processing module that processes a substrate using the processing liquid, the processing liquid supply method including:

replacing a container in which the processing liquid is stored in a pair of supply regions facing each other via a transfer region in a plan view, by using a common transfer mechanism provided in the transfer region between the pair of supply regions.

According to the present disclosure in some embodiments, it is possible to improve usability during supply of a processing liquid to a substrate processing apparatus.

The effects described herein are illustrative or exemplary only and are not restrictive. That is, the technique of the present disclosure may obtain other effects obvious to those skilled in the art from the description herein in addition to or in place of the above effects.

While certain embodiments have been described, these embodiments have been presented by way of example only, and are not intended to limit the scope of the disclosures. Indeed, the embodiments described herein may be embodied in a variety of other forms. Further, various omissions, substitutions and changes in the form of the embodiments described herein may be made without departing from the spirit of the disclosures. For example, constituent elements of the above embodiments may be arbitrarily combined. From this arbitrary combination, it is needless to say that the operations and effects of the respective constituent elements related to the combination may be obtained, and other operations and other effects obvious to those skilled in the art may be obtained from the description of the present specification.

What is claimed is:

1. A processing liquid supply apparatus for supplying a processing liquid to a substrate processing apparatus including a liquid processing module configured to process a substrate with the processing liquid, the processing liquid supply apparatus comprising:

a transfer region where a transfer mechanism configured to hold and transfer a container storing the processing liquid is provided; and a pair of supply regions provided to face each other via the transfer region in a plan view, wherein a supporter configured to support the container loaded from an outside of the processing liquid supply apparatus and a connection pipe connected to the container supported by the supporter are provided in each of the pair of supply regions, and wherein the processing liquid in the container supported by the supporter is supplied to the substrate processing apparatus via the connection pipe.

2. The processing liquid supply apparatus of claim 1, wherein the processing liquid supply apparatus is provided on a floor separately from the substrate processing apparatus, and is connected to the substrate processing apparatus by a processing liquid flow path.

3. The processing liquid supply apparatus of claim 1, wherein the transfer mechanism includes at least a holder configured to hold the container and an arm configured so as to move the holder.

4. The processing liquid supply apparatus of claim 3, further comprising a controller, wherein the controller is configured to control the holder to open and close a first lid of the container while holding the first lid.

5. The processing liquid supply apparatus of claim 3, wherein a rotational shaft configured to be rotatable and a second lid of the container configured to support the connection pipe are further provided in each of the pair of supply regions, wherein when the second lid is attached to the container, the connection pipe is connected to the container, and as the rotational shaft rotates, the second lid is rotated to be open and closed, wherein the processing liquid supply apparatus further comprises a controller, and wherein the controller is configured to control the holder to open and close the second lid while holding and rotating the rotational shaft.

6. The processing liquid supply apparatus of claim 1, further comprising a waiting region where the container waits before being loaded from the outside of the processing liquid supply apparatus and being transferred to each of the pair of supply regions, wherein the waiting region is provided separately from the pair of supply regions.

7. The processing liquid supply apparatus of claim 1, further comprising a recovery region where the container unloaded from each of the pairs of supply regions by the transfer mechanism waits until being unloaded to the outside of the processing liquid supply apparatus, wherein the recovery region is provided separately from the pair of supply regions.

8. The processing liquid supply apparatus of claim 7, further comprising a recovery line through which the container unloaded from the transfer region by the transfer mechanism is received and through which the container is transferred to the recovery region.

9. The processing liquid supply apparatus of claim 6, wherein the waiting region includes a first waiting region facing the transfer region via one of the pair of the supply regions in the plan view, and a second waiting region facing the transfer region via the other one of the pair of the supply regions in the plan view.

10. The processing liquid supply apparatus of claim 7, wherein the recovery region includes a first recovery region and a second recovery region, which face each other via the transfer region in the plan view.

11. A processing liquid supply method of supplying a processing liquid to a substrate processing apparatus including a liquid processing module configured to process a substrate with the processing liquid, the processing liquid supply method comprising:

replacing a container in which the processing liquid is stored in a pair of supply regions provided to face each other via a transfer region in a plan view, by using a transfer mechanism provided in the transfer region and common to the pair of supply regions.

* * * * *